US012635526B2

(12) United States Patent
Shin et al.

(10) Patent No.: US 12,635,526 B2
(45) Date of Patent: May 19, 2026

(54) SEMICONDUCTOR DEVICE AND METHOD OF MAKING AN EMI SHIELD USING INTENSIVE PULSED LIGHT IRRADIATION

(71) Applicant: STATS ChipPAC Pte. Ltd., Singapore (SG)

(72) Inventors: YongMoo Shin, Incheon (KR); HeeSoo Lee, Incheon (KR); SuJeong Kwon, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 498 days.

(21) Appl. No.: 18/329,871

(22) Filed: Jun. 6, 2023

(65) Prior Publication Data

US 2024/0413095 A1 Dec. 12, 2024

(51) Int. Cl.
| | |
|---|---|
| *H01L 23/552* | (2006.01) |
| *H01L 21/56* | (2006.01) |
| *H01L 23/31* | (2006.01) |
| *H10P 95/90* | (2026.01) |
| *H10W 42/20* | (2026.01) |
| *H10W 74/01* | (2026.01) |
| *H10W 74/10* | (2026.01) |
| *H10W 90/00* | (2026.01) |

(52) U.S. Cl.
CPC ............. *H10W 42/20* (2026.01); *H10P 95/90* (2026.01); *H10W 74/016* (2026.01); *H10W 74/117* (2026.01); *H10W 90/724* (2026.01)

(58) Field of Classification Search
CPC ............. H01L 23/552; H01L 23/3128; H10W 90/724; H10W 74/016; H10W 74/117; H10W 42/20
See application file for complete search history.

(56) References Cited

U.S. PATENT DOCUMENTS

| | | | |
|---|---|---|---|
| 8,535,553 B2 | 9/2013 | Kong et al. | |
| 9,144,183 B2 | 9/2015 | Chen et al. | |
| 10,421,123 B2 | 9/2019 | Jeong et al. | |
| 10,600,743 B2 | 3/2020 | Lee et al. | |
| 2009/0166819 A1* | 7/2009 | Chen | H01L 23/552 |
| | | | 257/659 |
| 2013/0037923 A1 | 2/2013 | Yoo | |
| 2017/0118836 A1 | 4/2017 | Kim et al. | |
| 2019/0109095 A1* | 4/2019 | Min | H01L 23/552 |
| 2019/0191597 A1* | 6/2019 | Han | H01Q 21/0087 |
| 2020/0339423 A1* | 10/2020 | Lin | H05K 7/20336 |

(Continued)

FOREIGN PATENT DOCUMENTS

| | | | | |
|---|---|---|---|---|
| CN | 206976326 U | * | 2/2018 | ......... H01L 21/6836 |
| CN | 107353017 B | * | 4/2021 | ............. C01F 7/021 |
| JP | 2011171523 A | * | 9/2011 | |

(Continued)

*Primary Examiner* — Lawrence C Tynes, Jr.
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and an electrical component disposed over the substrate. An encapsulant is deposited over the electrical component. A shielding layer is formed over the encapsulant. The shielding layer includes a plurality of graphene-coated metal balls in a matrix. The shielding layer is sintered using intensive pulsed light (IPL) radiation.

19 Claims, 9 Drawing Sheets

(56) References Cited

U.S. PATENT DOCUMENTS

| 2020/0343196 | A1* | 10/2020 | Tsai | ..................... | H01Q 1/2283 |
| 2023/0291369 | A1* | 9/2023 | Kim | ........................ | H03F 3/245 |

FOREIGN PATENT DOCUMENTS

| KR | 1020120132424 | | 12/2012 | | |
| KR | 101465616 | | 11/2014 | | |
| KR | 101895114 | | 9/2018 | | |
| KR | 20180108344 | A * | 10/2018 | ............ | H01B 1/026 |
| KR | 102395247 | | 5/2022 | | |
| WO | 2015152625 | A1 | 10/2015 | | |

* cited by examiner

SEMICONDUCTOR DEVICE AND METHOD OF MAKING AN EMI SHIELD USING INTENSIVE PULSED LIGHT IRRADIATION

FIELD OF THE INVENTION

The present invention relates in general to semiconductor devices and, more particularly, to a semiconductor device and method of making an electromagnetic interference (EMI) shielding layer using intensive pulsed light irradiation.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive shielding layers can be formed over semiconductor packages to reduce interference. However, the typical shielding layer process, using a sprayed metal layer over the package, has several significant downsides. One major issue is that a time-consuming thermal process is required to sinter the metal particles. Therefore, a need exists for an improved shielding layer and method of making.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the semiconductor package. The electrical connections can be made with conductive layers, bumps, stud bumps, conductive paste, or wirebonds. An encapsulant or other molding material is deposited over the semiconductor package to provide physical support and electrical isolation. The finished semiconductor package is then inserted into an electrical system and the functionality of the semiconductor device is made available to the other system components.

Figure 1A:
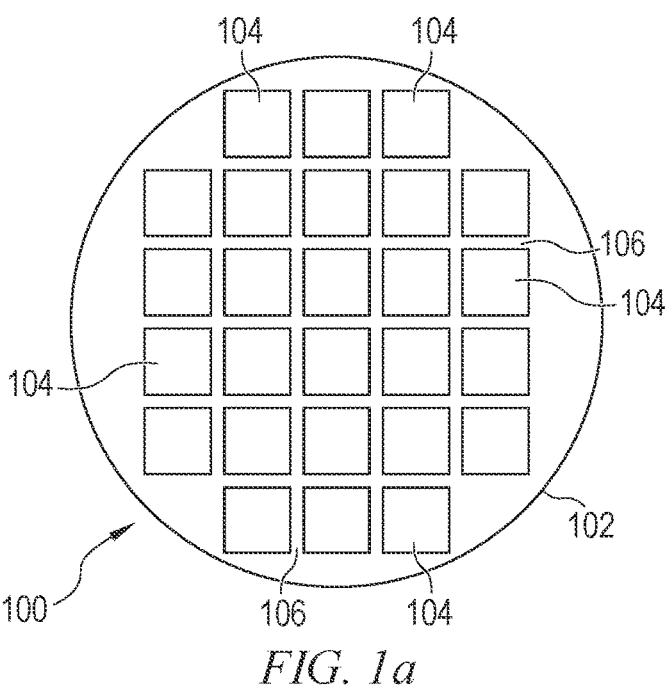
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Alternatively, wafer 100 can be a mold surface, organic or inorganic substrate, or target substrate suitable for graphene transfer.

Figure 1B:
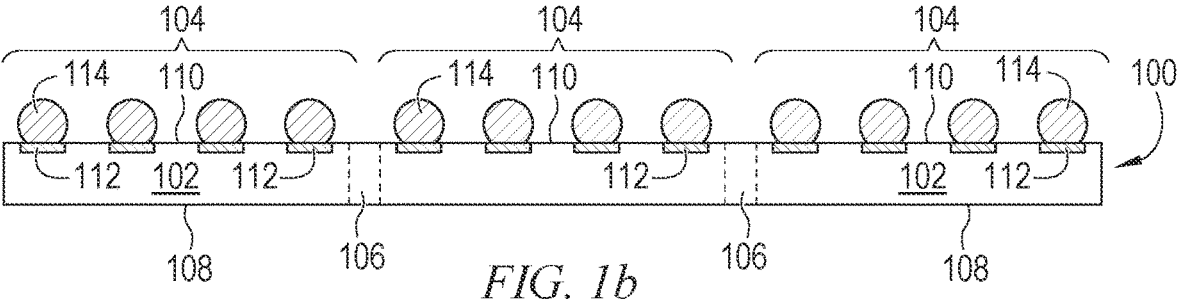

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed over or within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, power devices, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process.

Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
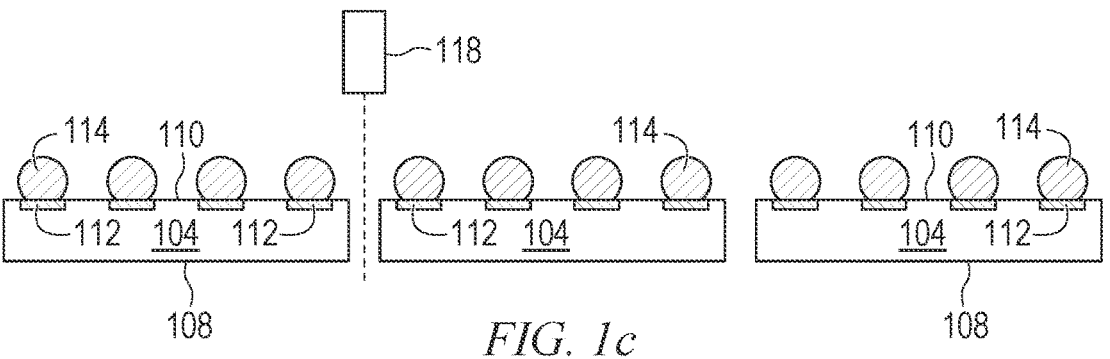

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) or known good unit (KGU) after singulation.

Figure 2A:
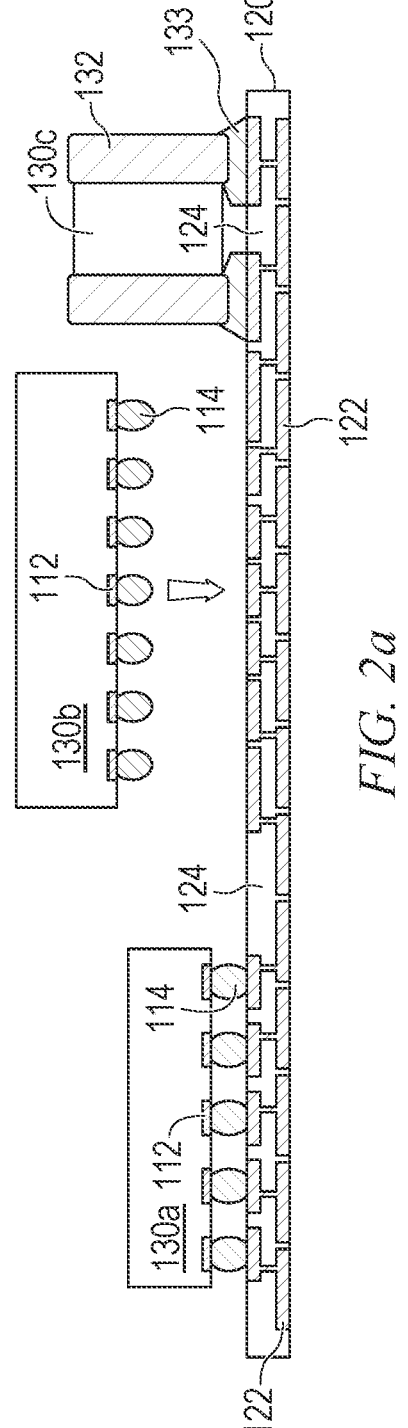
FIGS. 2a-2g illustrate a process of forming a semiconductor package with a graphene-based shielding layer sintered by intensive pulsed light irradiation.

FIGS. 2a-2g illustrate a process of forming a semiconductor package with a graphene-based shielding layer sintered by intensive pulsed light (IPL) irradiation. FIG. 2a shows a cross-sectional view of multi-layered interconnect substrate 120 including conductive layers 122 and insulating layers 124. While only a single substrate 120 suitable to form a single semiconductor package is shown, hundreds or thousands of units are commonly manufactured and processed as part of a single substrate 120 before being singulated from each other, using the same steps described herein performed en masse. A separate substrate 120 could also be used for each unit being manufactured, the substrate being singulated before the steps shown in FIG. 2a and a plurality of individual substrates being placed on a common carrier for processing.

Conductive layer 122 can be one or more layers of Al, Cu, Sn, Ni, Au, Ag, or other suitable electrically conductive material. Conductive layers can be formed using PVD, CVD, electrolytic plating, electroless plating, or another suitable metal deposition process. Conductive layer 122 provides horizontal electrical interconnect across substrate 120 and vertical electrical interconnect between top and bottom surfaces of substrate 120. Portions of conductive layer 122 can be electrically common or electrically isolated depending on the design and function of semiconductor die 104 and other electrical components.

Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering, or thermal oxidation. Insulating layer 124 provides isolation between conductive layers 122. Any number of conductive layers 122 and insulating layers 124 can be interleaved over each other to form substrate 120. Any other suitable type of package substrate or leadframe is used for substrate 120 in other embodiments.

Electrical components 130a-130c are disposed on substrate 120 and electrically and mechanically connected to conductive layers 122. For example, electrical component 130c can be a discrete electrical device, such as a diode, transistor, resistor, capacitor, and inductor. Electrical components 130a and 130b can be, or be similar to, semiconductor die 104 from FIG. 1c with bumps 114 oriented toward substrate 120. Electrical components 130a and 130b can be identical semiconductor die or may have different functions that supplement each other.

Electrical components 130 disposed on substrate 120 can include other semiconductor die, semiconductor packages, surface mount devices, RF components, and discrete electrical devices. Any of the electrical components 130 can have integrated passive devices (IPDs) formed in or on the electrical components. Any number and type of electrical component can be mounted either on the top or bottom surface of substrate 120.

Electrical components 130a-130c are positioned over substrate 120 using a pick and place machine or operation. Electrical components 130a-130c are brought into contact with conductive layer 122 of substrate 120. Terminals 132 of electrical component 130c are electrically and mechanically connected to conductive layer 122 using solder or conductive paste 133. Electrical components 130a and 130b are electrically and mechanically connected to conductive layer 122 by reflowing bumps 114.

Figure 2B:
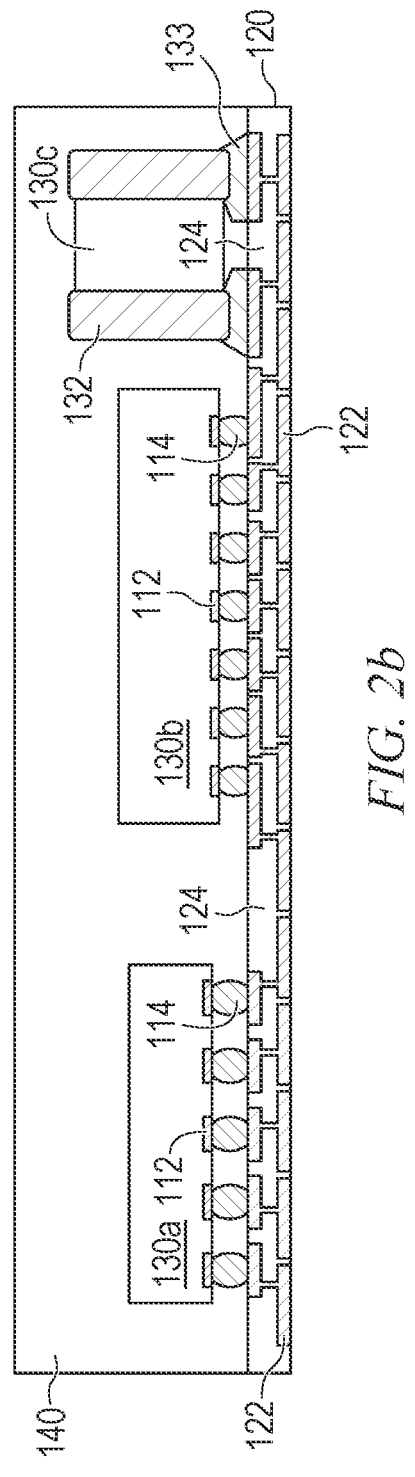

In FIG. 2b, encapsulant or molding compound 140 is deposited over and around electrical components 130a-130c and substrate 120 using a paste printing, compressive molding, transfer molding, liquid encapsulant molding, vacuum lamination, spin coating, or other suitable applicator. Encapsulant 140 can be liquid or granular polymer composite material, such as epoxy resin, epoxy acrylate, or another suitable polymer, with or without a suitable filler. Encapsulant 140 is non-conductive, provides structural support, and environmentally protects the semiconductor device from external elements and contaminants. Top surfaces of one or more components 130 can be exposed from encapsulant 140, to allow for subsequent electrical, mechanical, or thermal connection, by using film-assisted molding or by backgrinding after deposition of the encapsulant.

Figures 2C, 2D:
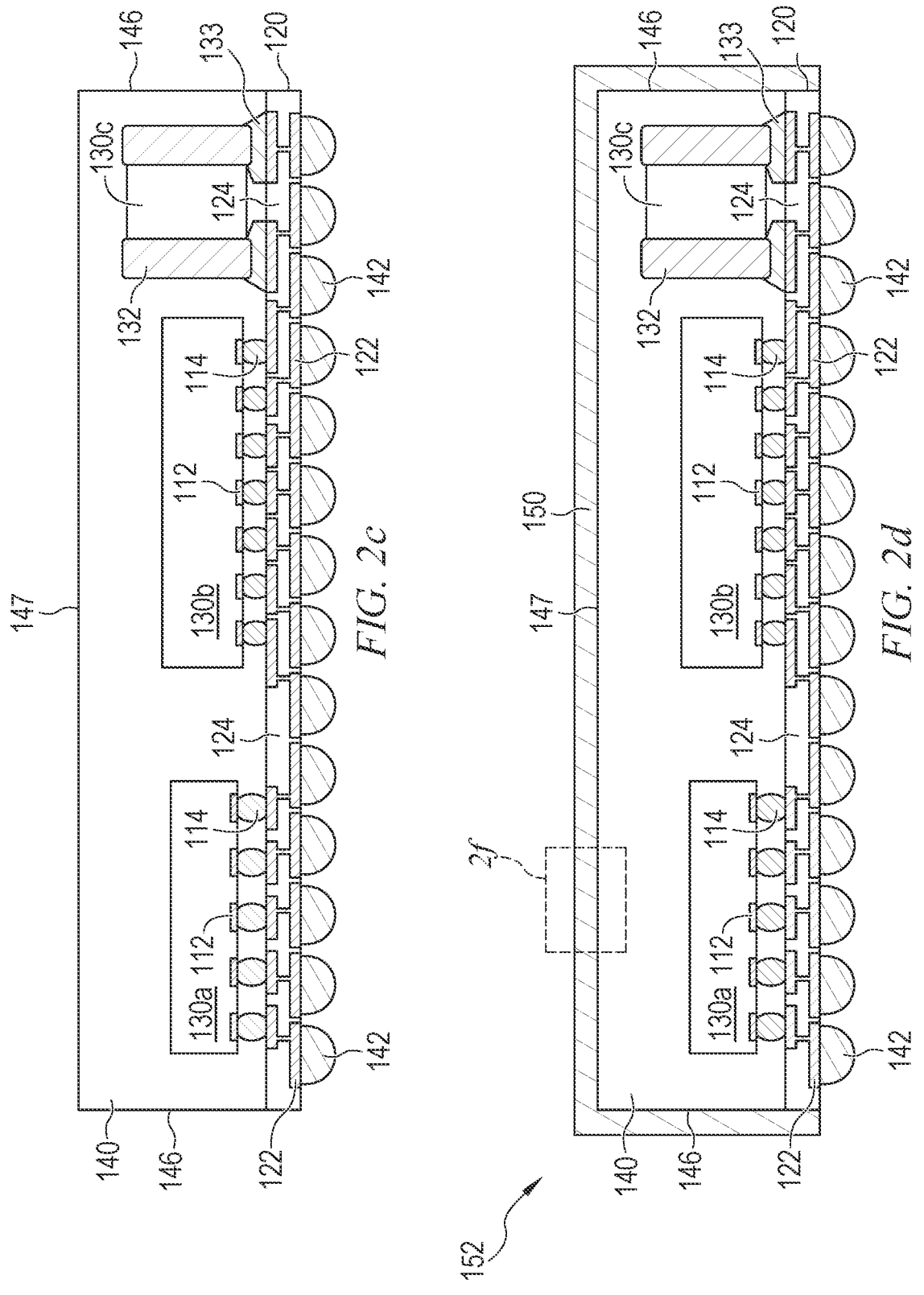

In FIG. 2c, bumps 142 are formed on the bottom surface of substrate 120, opposite encapsulant 140. Bumps 142 are formed as described above for bumps 114 on semiconductor die 104. The panel of substrate 120 and encapsulant 140 is flipped for the formation of bumps 142. In embodiments where multiple units are formed on a single substrate, the units are singulated from each other, which leaves side surfaces 146 of each unit exposed. Top surface 147 is a planar surface formed by the molding process or by backgrinding encapsulant 140. Bumps 142 can be formed before or after singulation. Singulation can occur with the units oriented as shown in FIG. 2c, or while flipped for formation of bumps 142.

To address electromagnetic interference (EMI), radio frequency interference (RFI), harmonic distortion, and inter-device interference, a shielding layer 150 is formed over top surface 147 and side surfaces 146 to reduce or inhibit the effects of EMI, RFI, and other inter-device interference, as shown in FIG. 2d. Shielding layer 150 is comprised of metal balls with a graphene coating. The metal balls are typically either silver or copper, but any other conductive material is used in other embodiments. The graphene-coated metal balls are suspended or disposed in a matrix to form a conductive ink. The conductive ink can be sprayed, sputtered, inkjet printed, or applied to semiconductor package 152 using any other suitable means, e.g., those described above for forming conductive layer 122.

Figure 2E:
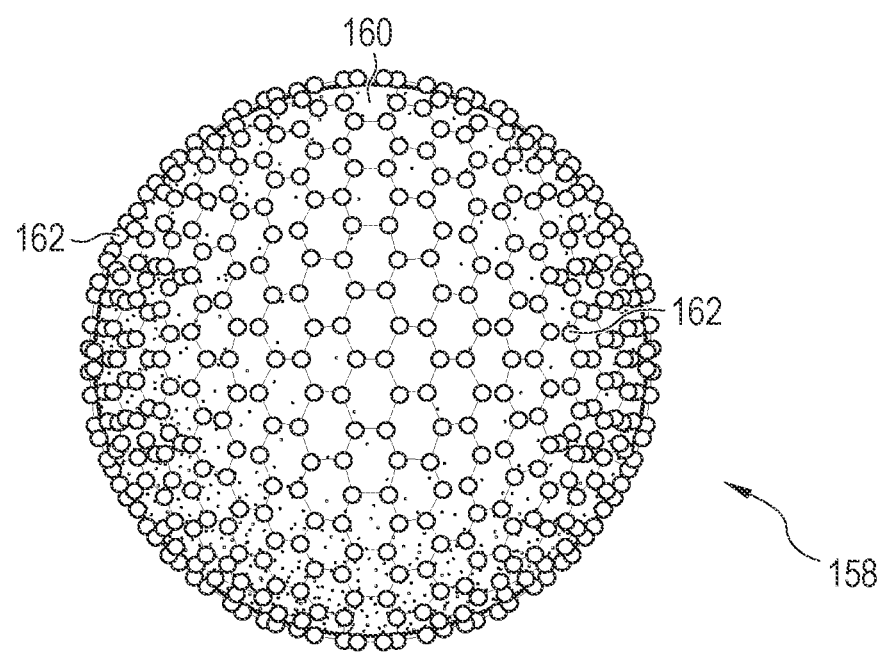

FIG. 2e illustrates detail of one of the graphene-coated metal balls 158 of shielding layer 150. Graphene-coated metal balls 158 are formed of a core 160 and a graphene shell or coating 162 formed on and around the core. In one embodiment, core 160 is Cu, Ag, Ni, phase change material (PCM), or other suitable metal or similar material. In some embodiments, a mix of some Cu cores 160 and some Ag cores 160 are used. FIG. 2e illustrates detail of graphene shell 162 formed as a mesh network around core 160. Graphene shell 162 is an allotrope of carbon with one or more layers of carbon atoms each arranged in a two-dimensional (2D) honeycomb lattice. Graphene shell 162 can be formed by CVD, wet chemical synthesis, or other suitable means. A plurality of graphene coatings 162 is formed on each core 160 in some embodiments.

For CVD, core 160 is placed in a chamber heated to 900-1080° C. A gas mixture of CH$_4$/H$_2$/Ar is introduced into the chamber to initiate a CVD reaction. The carbon source decomposes in the high-temperature reaction chamber as the CVD reaction separates the carbon atoms from the hydrogen atoms, leaving graphene shell 162 on core 160. The release of carbon atoms over core 160 forms a continuous sheet of graphene shell 162. Additional information related to forming graphene coating 162 is disclosed in U.S. Pat. Nos. 8,535,553, 10,421, 123, Korean Patent No. KR101465616, and Korean Patent No. KR101895114, which are all incorporated herein by reference.

Figure 2F:
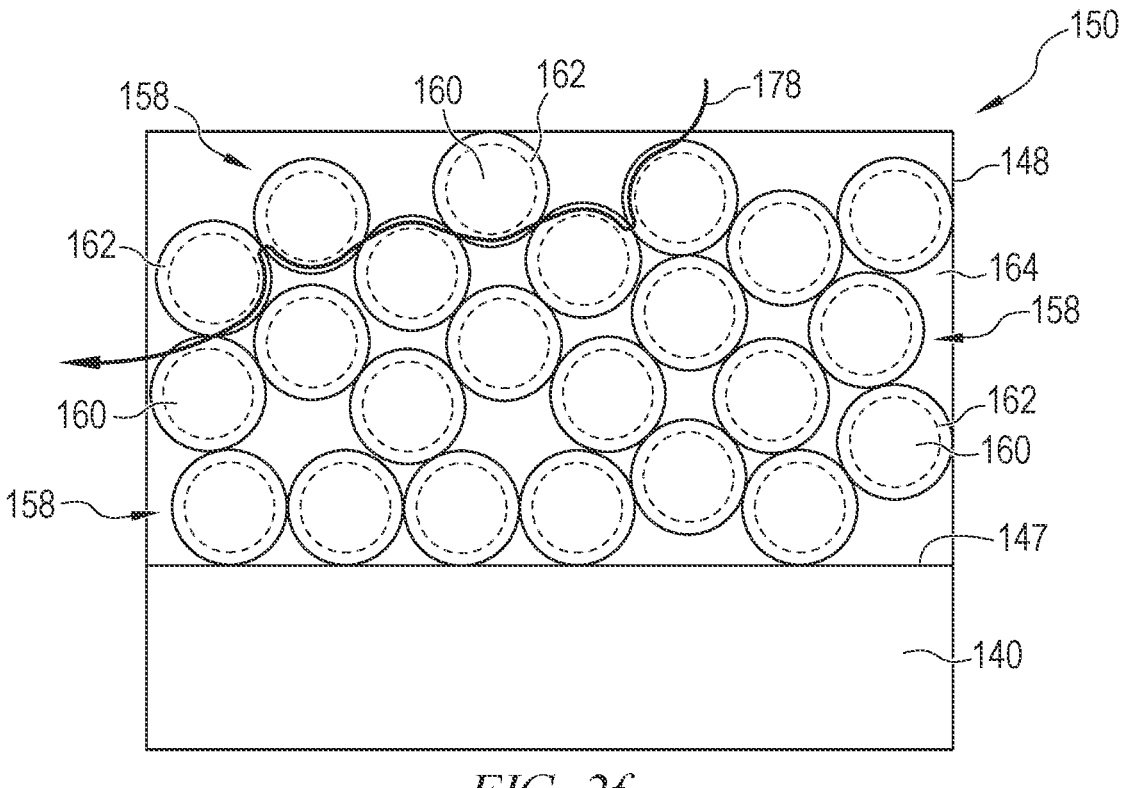

FIG. 2f shows further detail of shielding layer 150 formed from a plurality of graphene-coated metal balls 158. In one embodiment, shielding layer 150 includes matrix 164 and a plurality of cores 160 with graphene coating 162 embedded within the matrix. In one embodiment, matrix 164 is a thermoset material, such as epoxy resin or adhesive with binder and filler containing alumina, Al, aluminum zinc oxide, or other material having good conductive properties. Matrix 164 can be thermal grease such as silicon or polymer type, e.g., polymethyl methacrylate (PMMA) or polyethylene terephthalate (PET). Matrix 164 can be epoxy, polyester, or acryl in other embodiments. In another embodiment, matrix 164 is a polymer or composite epoxy with dispersed graphene, carbon nanotubes, conductive polymers, and the like. Shielding layer 150 can be applied as an ink of graphene-coated metal balls 158 floating in matrix 164.

Each core 160, as embedded in matrix 164, is surrounded or covered by graphene coating or shell 162. In one embodiment, graphene shell 162 is a graphene paste or ink formed around a Cu or Ag core. In one embodiment, some cores 162 are formed from Cu while others are formed from Ag. Graphene coating 162 of each core 160 contacts the graphene coating of one or more adjacent cores. Cores 160 have sufficient density that most if not all the graphene coatings around the cores contact at least one graphene coating around an adjacent core, and typically contact graphene coating of multiple adjacent cores.

Each graphene-coated metal ball 158 physically contacts adjacent graphene-coated metal balls within matrix 164 to create an electrically conductive path 178 including portions of interconnected graphene shells 162 on adjacent balls 158. The electrically conductive path 178 dissipates any charge incident on shielding layer 150, such as an EMI or RFI, to ground. The dissipation of charges through many electrically conductive paths like 178 in balls 158 operates to reduce or inhibit the effects of EMI, RFI, and other inter-device interference.

Figure 2G:
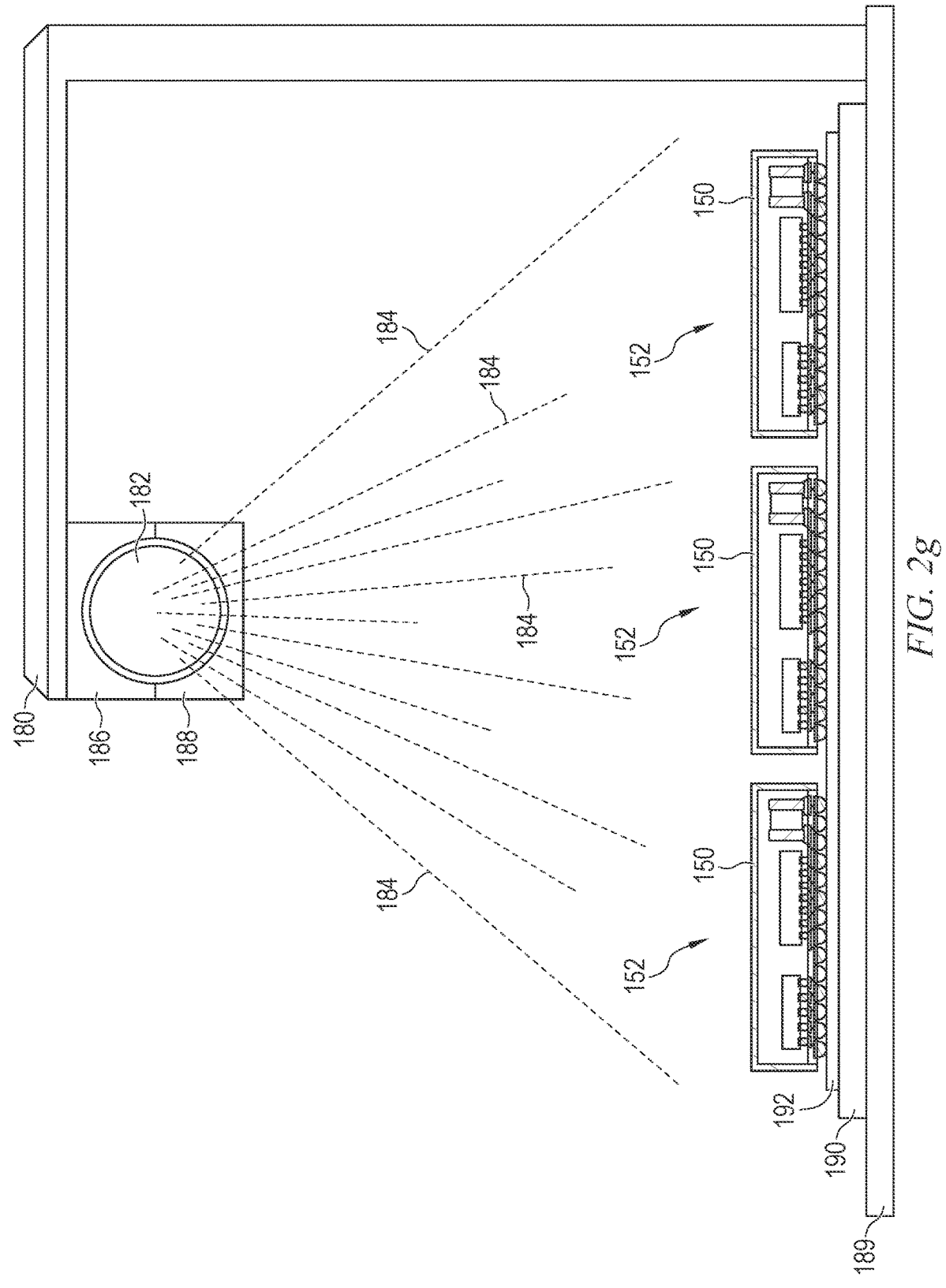

To ensure establishment of conductive paths 178 between all adjacent balls 158, packages 152 are sintered as shown in FIG. 2g. Sintering is performed using an IPL device 180. IPL device 180 includes a xenon flashlamp 182 that emits light rays 184. Reflector 186 reflects light rays 184 to increase the amount of light emitted downward toward packages 152. An ultraviolet filter 188 filters light rays 184. Platform 189 holds the devices being processed.

IPL uses intense pulses of non-coherent light emitted over a range of wavelengths. In one embodiment, the IPL wavelength extends from approximately 350 nm to 1200 nm. Xenon flashlamp 182 produces high output bursts of broadspectrum light 184. Light 184 hitting matrix 164 with balls 158 sinters shielding layer 150 to solidify the material and electrical connections between the balls. Sintering shielding layer 150 with IPL irradiation can be completed in only several milliseconds, whereas traditional metal shielding layers in the prior art require a thermal heating process typically taking between 30 and 90 minutes.

For the IPL irradiation process, a plurality of packages 152 is picked and placed onto a carrier or temporary substrate 190 containing sacrificial base material such as silicon, polymer, beryllium oxide, glass, or other suitable low-cost, rigid material for structural support. An interface layer or double-sided tape 192 is formed or disposed over carrier 190 as a temporary adhesive bonding film, thermal release layer, or UV release layer. Carrier 190 can be a round or rectangular panel with capacity for multiple packages at once. While only three units are illustrated, hundreds, thousands, or more packages may be placed together on a common carrier 190 for sintering. Packages 152 can be on the same carrier 190 for singulation, deposition of shielding layer 150, and sintering. After sintering with light 184, packages 152 are picked and placed into a larger electronic device or a tape-and-reel for delivery to a customer.

In some embodiments, packages 152 are placed into an oven for pre-processing before IPL irradiation. The oven temperature is set to between 170° C. and 280° C., and packages 152 are heated for between 30 seconds and two minutes. In one embodiment, packages 152 are heated at 250° C. for one minute. The oven pre-processing removes organic solvent from shielding layer 150. In some embodiments, packages 152 are placed into an oven for post-processing after IPL irradiation. The oven temperature for post-processing is between 90° C. and 120° C. for a length of time between five and ten minutes. Post-processing in the oven stabilizes the sintered material.

Forming packages 152 with sintering done by IPL irradiation increases the number of units per hour (UPH) that can be manufactured, thus reducing manufacturing costs. Moreover, graphene has ten times the electrical conductivity of copper or silver by themselves so shielding layer 150 has an increased EMI blocking capability compared to the prior art. Graphene coating 162 also reduces metal oxidation and ion migration.

Figures 3A, 3B:
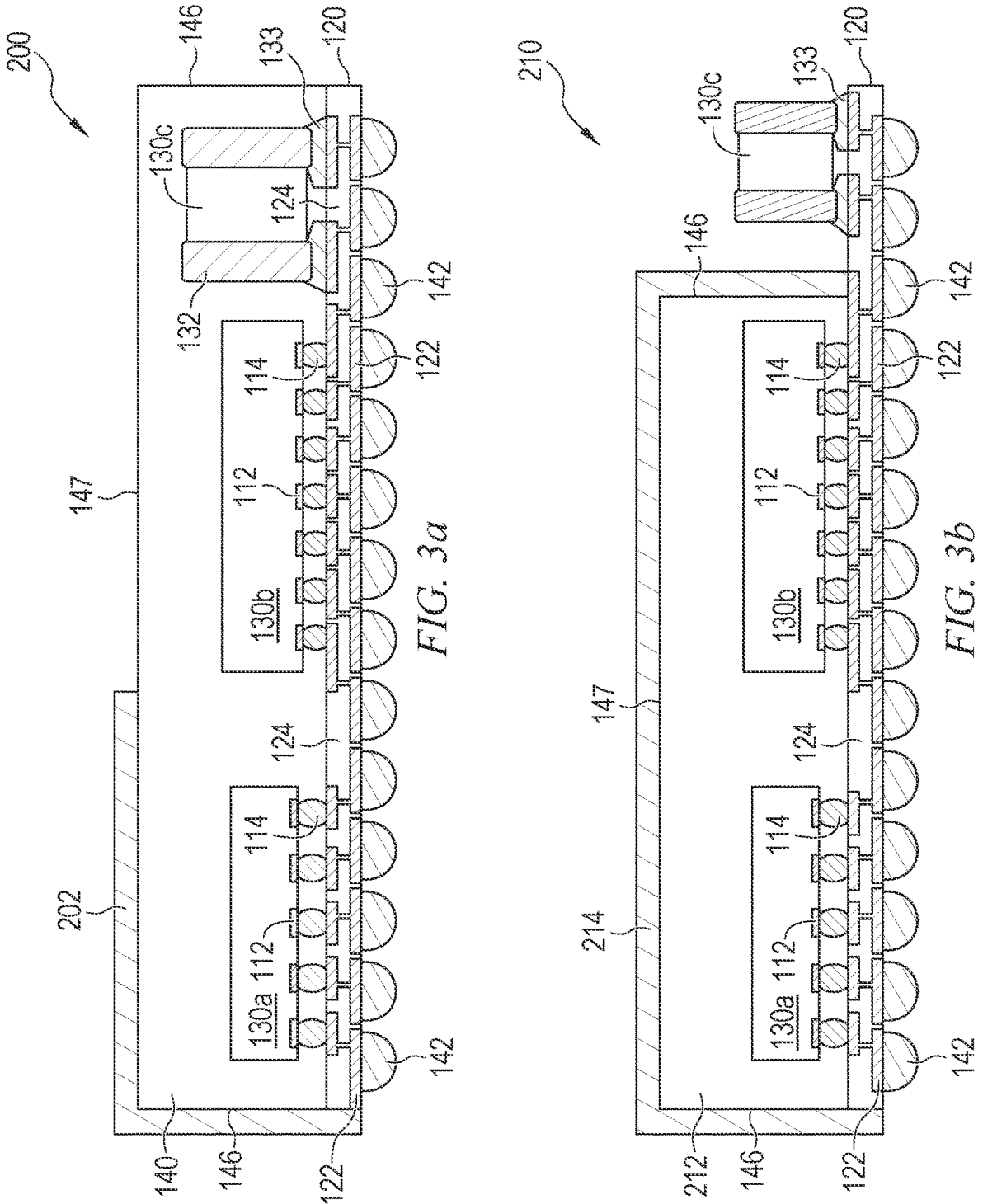
FIGS. 3a-3d illustrate additional embodiments.

FIGS. 3a-3d illustrate additional embodiments for semiconductor packages formed with a graphene shielding layer and sintered using IPL irradiation. FIG. 3a shows semiconductor package 200 with shielding layer 202. Shielding layer 202 is formed over encapsulant 140 as described above for shielding layer 150, except that the shielding layer is formed selectively over only a portion of semiconductor package 200. Shielding layer 202 is formed over electronic device 130a but not electronic device 130b and 130c. A portion of encapsulant 140 remains free and exposed from shielding layer 202. Shielding layer 202 is selectively formed using a masking layer to remove part of the shielding layer, or by inkjet printing over only the desired portion of package 200.

FIG. 3a illustrates a portion of conductive layer 122 extending laterally to the left edge of substrate 120, and thereby electrically connecting to shielding layer 202. Any above or below embodiment can have the same feature. The electrical connection can be used to ground shielding layer 202 and improve shielding performance.

FIG. 3b illustrates an embodiment with package 210 having only a portion of substrate 120 disposed under encapsulant 212. Encapsulant 212 is formed over only a portion of substrate 120 by using a mold that blocks encapsulant from the rest of the substrate, or by etching the encapsulant after deposition. Shielding layer 214 is deposited only over encapsulant 212 and not over the portion of substrate 120 outside the encapsulant. A mask or lid is placed over the portion of substrate 120 outside encapsulant 212 to block shielding layer 214 from being formed thereon. Laser ablation is used to remove the shielding layer in another embodiment. Shielding layer 214 can also be inkjet printed on encapsulant 214 to control the location where the shielding layer is and is not formed.

The electrical components outside of encapsulant 212 and shielding layer 214, e.g., electrical component 130c, can be placed on substrate 120 before encapsulant 212, after shielding layer 214 is formed, or between the encapsulant and shielding layer. Any number and type of components can be disposed within and without encapsulant 212. Conductive layer 122 extends to the right edge of encapsulant 212 so that the shielding layer physically and electrically contacts the conductive layer where the shielding layer extends to the top surface of substrate 120.

Figures 3C, 3D:
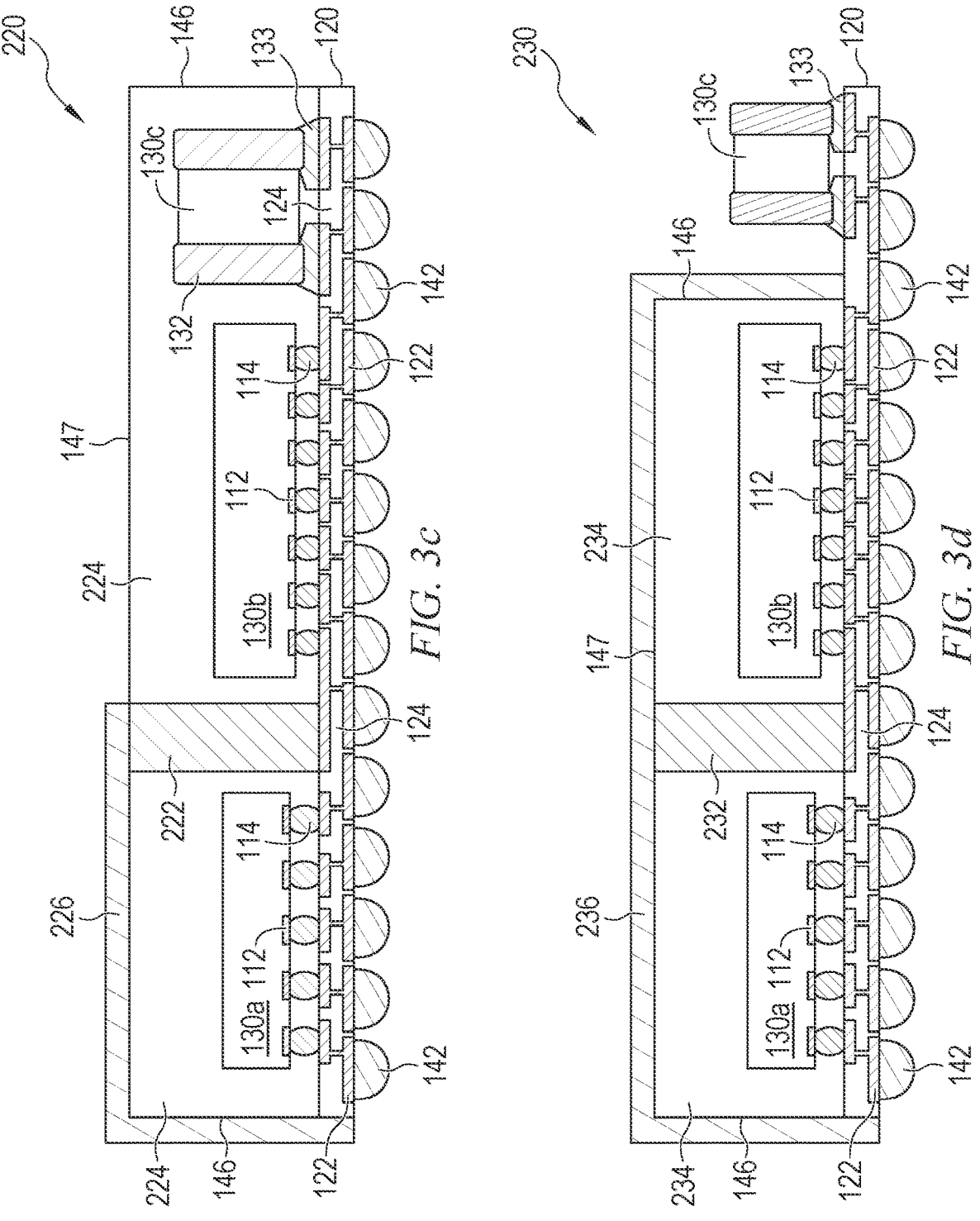

FIG. 3c shows semiconductor package 220, with selective shielding as in FIG. 3a and an additional conductive pillar or wall 222 disposed in encapsulant 224. Pillar 222 can be formed or disposed on substrate 120 before encapsulant 224 is deposited, or an opening can be formed through the encapsulant for pillar 222 to be deposited or disposed into. Conductive pillar 222 can be a plurality of pillars disposed periodically around, e.g., electrical component 130a. In another embodiment, conductive pillar 222 extends continuously around select components. Conductive pillar 222 can either extend in a circuitous path around the desired components or may contact shielding layer 226 at the ends of the pillar route. Pillars 222 provide EMI shielding in combination with shielding layer 226. Shielding layer 226 completely covers the area surrounded by pillar 222 so that the combination provides continuous shielding around all sides and the top of electrical component 130a. Conductive layer 122 extends under and directly physically contacts conductive pillars 222 to improve grounding of the shielding layer.

FIG. 3d illustrates semiconductor package 230 with conductive pillar 232 formed through encapsulant 234, in a similar manner to pillar 222. Encapsulant 234 and shielding layer 236 are formed over only a portion of substrate 120 as described above for package 210. Electrical component 130c remains outside of encapsulant 234 and shielding layer 236. Pillar 232 provides lateral EMI protection between electrical components 130a and 130b.

Figure 4A:
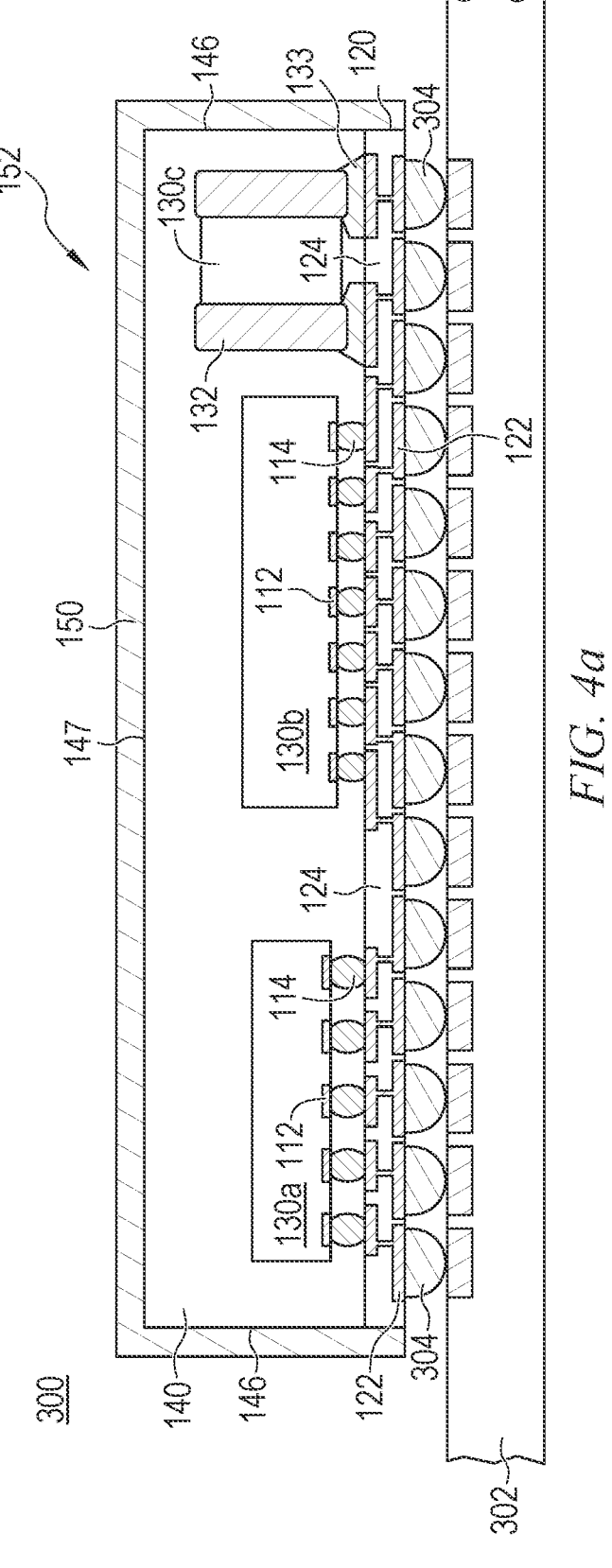
FIGS. 4a and 4b illustrate integrating the semiconductor packages into an electronic device.
Figure 4B:
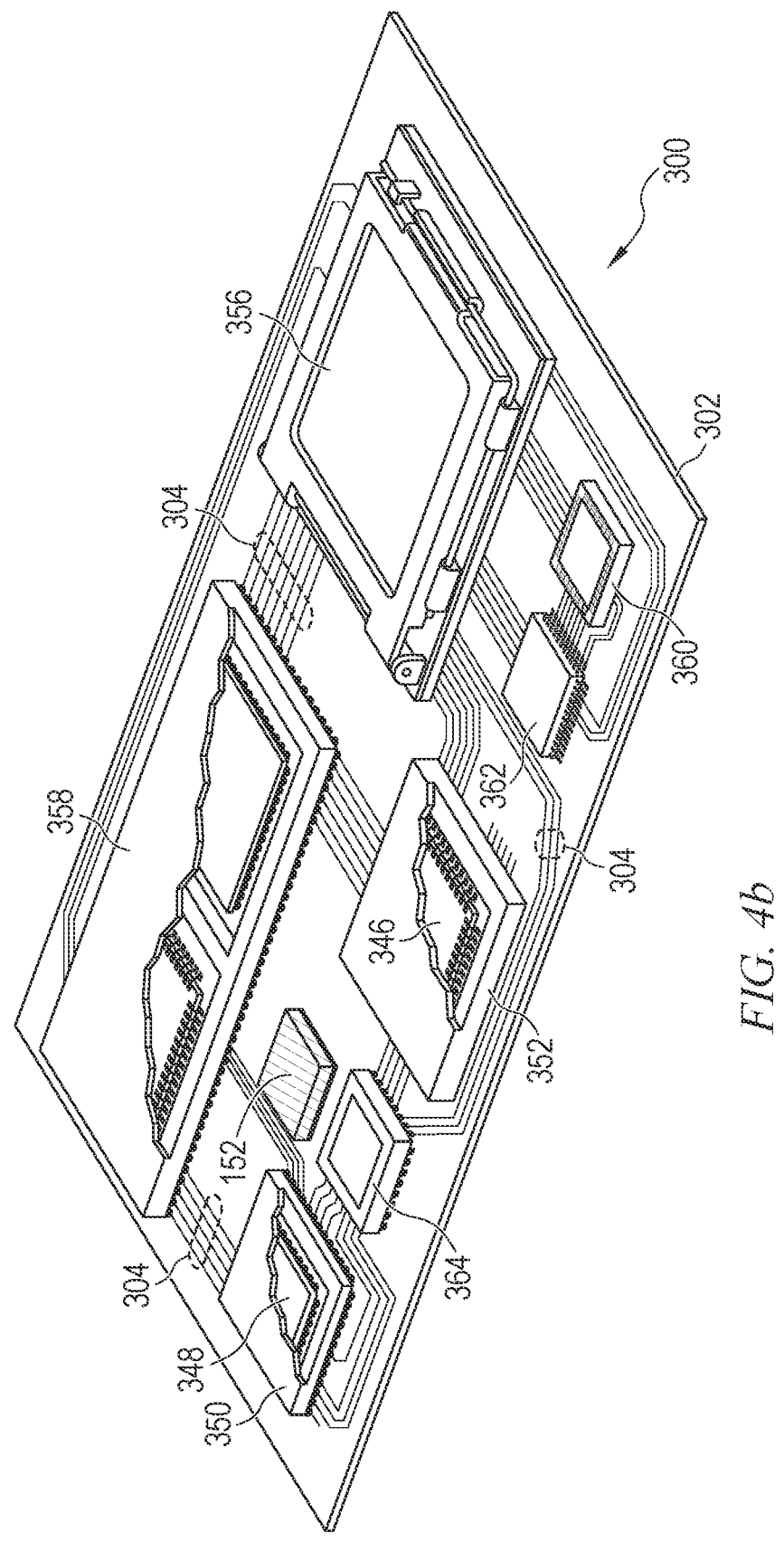

FIGS. 4a and 4b illustrate integrating the above-described semiconductor packages and devices, e.g., semiconductor package 152, into a larger electronic device 300. FIG. 4a illustrates a partial cross-section of semiconductor package 152 mounted onto a printed circuit board (PCB) or other substrate 302 as part of electronic device 300. Bumps 142 are reflowed onto conductive layer 304 of PCB 302 to physically attach and electrically connect semiconductor package 152 to the PCB. In other embodiments, thermocompression or other suitable attachment and connection methods are used. In some embodiments, an adhesive or underfill layer is used between semiconductor package 152 and PCB 302. Electrical components 130a-130c are electrically coupled to conductive layer 304 through bumps 142 and substrate 120.

FIG. 4b illustrates electronic device 300 having a chip carrier substrate or PCB 302 with a plurality of semiconductor packages disposed on a surface of PCB 302, including semiconductor package 152. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASICs, logic circuits, analog circuits, RF circuits, discrete devices, or other semiconductor die or electrical components. Miniaturization and weight reduction are essential for the products to be accepted by the market. The distance between semiconductor devices may be decreased to achieve higher density. PCB 302 may have a more irregular shape to fit conveniently into more ergonomic and smaller device shells.

In FIG. 4b, PCB 302 provides a general substrate for structural support and electrical interconnect of the semiconductor packages disposed on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) or SIP module 358, quad flat non-leaded package (QFN) 360, quad flat package 362, and embedded wafer level ball grid array (eWLB) 364 are shown disposed on PCB 302. In one embodiment, eWLB 364 is a fan-out wafer level package (Fo-WLP) or a fan-in wafer level package (Fi-WLP).

Depending upon the system requirements, any combination of semiconductor packages, configured with any combination of first and second level packaging styles, as well as other electrical components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a substrate;

disposing an electrical component over the substrate;

depositing an encapsulant over the electrical component;

forming a shielding layer over the encapsulant, wherein the shielding layer includes a plurality of graphene-coated metal balls in a matrix; and sintering the shielding layer by intensive pulsed light (IPL) irradiation.

2. The method of claim 1, further including:

forming a conductive pillar on the substrate; and forming the shielding layer on the conductive pillar.

3. The method of claim 1, further including forming the shielding layer selectively.

4. The method of claim 1, further including disposing a second electrical component over the substrate, wherein the depositing an encapsulant step leaves the second electrical component outside the encapsulant.

5. The method of claim 1, wherein the plurality of graphene-coated metal balls comprise a plurality of cores formed from copper or silver, and each of the plurality of cores includes a graphene coating.

6. The method of claim 1, further including forming the shielding layer by inkjet printing.

7. A method of making a semiconductor device, comprising:

providing a substrate;

disposing an electrical component over the substrate;

depositing an encapsulant over the electrical component;

forming a shielding layer over the encapsulant, wherein the shielding layer includes a plurality of graphene-coated metal balls; and sintering the shielding layer by intensive pulsed light (IPL) irradiation.

8. The method of claim 7, further including:

forming a conductive pillar over the substrate; and forming the shielding layer over the conductive pillar.

9. The method of claim 8, wherein the conductive pillar completely or partially surrounds the electrical component in either a continuous path or as a plurality of discrete pillars.

10. The method of claim 7, further including forming the shielding layer selectively.

11. The method of claim 7, further including disposing a second electrical component over the substrate, wherein the depositing an encapsulant step leaves the second electrical component outside the encapsulant.

12. The method of claim 7, wherein the plurality of graphene-coated metal balls comprise a plurality of cores formed from copper or silver, and each of the plurality of cores includes a graphene coating.

13. The method of claim 7, further including forming the shielding layer by inkjet printing.

14. A semiconductor device, comprising:

a substrate;

an electrical component disposed over the substrate;

an encapsulant deposited over the electrical component; and a shielding layer formed over the encapsulant, wherein the shielding layer includes a plurality of graphene-coated metal balls.

15. The semiconductor device of claim 14, further including a conductive pillar disposed over the substrate, wherein the conductive pillar extends from the substrate to the shielding layer.

16. The semiconductor device of claim 15, wherein the conductive pillar completely or partially surrounds the electrical component in either a continuous path or as a plurality of discrete pillars.

17. The semiconductor device of claim 14, wherein a portion of the encapsulant is exposed from the shielding layer.

18. The semiconductor device of claim 14, further including a second electrical component disposed over the substrate outside the encapsulant and shielding layer.

19. The semiconductor device of claim 14, wherein the plurality of graphene-coated metal balls comprise a plurality of cores formed from copper or silver, and each of the plurality of cores includes a graphene coating.

* * * * *